US010931257B2

(12) United States Patent
Stokes et al.

(10) Patent No.: US 10,931,257 B2
(45) Date of Patent: Feb. 23, 2021

(54) WLP BAW DEVICE WITH THROUGH-WLP VIAS

(71) Applicant: Qorvo US, Inc., Greensboro, NC (US)

(72) Inventors: Paul Stokes, Orlando, FL (US); Fabien Dumont, Longwood, FL (US); Buu Quoc Diep, Murphy, TX (US)

(73) Assignee: Qorvo US, Inc., Greensboro, NC (US)

( * ) Notice: Subject to any disclaimer, the term of this patent is extended or adjusted under 35 U.S.C. 154(b) by 32 days.

(21) Appl. No.: 16/222,057

(22) Filed: Dec. 17, 2018

(65) Prior Publication Data

US 2020/0007111 A1 Jan. 2, 2020

Related U.S. Application Data

(60) Provisional application No. 62/691,448, filed on Jun. 28, 2018.

(51) Int. Cl.
| | |
|---|---|
| *H03H 9/10* | (2006.01) |
| *H03H 9/02* | (2006.01) |
| *H03H 9/05* | (2006.01) |
| *H01L 23/31* | (2006.01) |
| *H03H 9/17* | (2006.01) |

(52) U.S. Cl.
CPC .......... *H03H 9/105* (2013.01); *H01L 23/315* (2013.01); *H03H 9/02007* (2013.01); *H03H 9/0523* (2013.01); *H03H 9/17* (2013.01)

(58) Field of Classification Search
CPC .. H03H 9/105; H03H 9/0523; H03H 9/02007; H03H 9/17; H01L 23/315

USPC ......................................... 333/133, 187, 188
See application file for complete search history.

(56) References Cited

U.S. PATENT DOCUMENTS

| 7,498,900 B2 * | 3/2009 | Lee ..................... H01L 27/0805 |
| | | 333/133 |
| 2005/0056917 A1* | 3/2005 | Kwon .................... B81B 7/007 |
| | | 257/678 |
| 2016/0204761 A1* | 7/2016 | Lee .......................... H03H 3/02 |
| | | 333/187 |
| 2018/0183406 A1* | 6/2018 | Patil ........................ H03H 3/02 |

* cited by examiner

*Primary Examiner* — Robert J Pascal
*Assistant Examiner* — Jorge L Salazar, Jr.
(74) *Attorney, Agent, or Firm* — Withrow & Terranova, P.L.L.C.

(57) ABSTRACT

The present disclosure relates to a wafer-level packaged (WLP) bulk acoustic wave (BAW) device, which includes a BAW resonator, a WLP enclosure, and an interconnect. The BAW resonator includes a piezoelectric layer with an opening, a bottom electrode lead underneath the opening, and an interface structure extending over the opening and in contact with the bottom electrode lead through the opening. The WLP enclosure includes a cap, an outer wall that extends from the cap toward the piezoelectric layer to form a cavity, and a through-WLP via that extends through the cap and the outer wall and is vertically aligned with the opening of the piezoelectric layer. A portion of the interface structure is exposed to the through-WLP via. The interconnect is formed in the through-WLP via and electrically connected to the interface structure.

24 Claims, 6 Drawing Sheets

WLP BAW DEVICE WITH THROUGH-WLP VIAS

RELATED APPLICATIONS

This application claims the benefit of provisional patent application Ser. No. 62/691,448, filed Jun. 28, 2018, the disclosure of which is hereby incorporated herein by reference in its entirety.

FIELD OF THE DISCLOSURE

The present disclosure relates to a wafer-level packaged (WLP) bulk acoustic wave (BAW) device, and in particular to a WLP BAW device with through-WLP vias.

BACKGROUND

Due to their small size, high Q values, and very low insertion losses at microwave frequencies, particularly those above 1.5 Gigahertz (GHz), Bulk Acoustic Wave (BAW) devices have been widely used in modern wireless applications. For instance, BAW filters are the filter of choice for many $3^{rd}$ Generation (3G) and $4^{th}$ Generation (4G) wireless devices, and are destined to dominate filter applications for $5^{th}$ Generation (5G) wireless devices. The low insertion loss of the BAW filter provides many advantages such as improved battery life, compensation for higher losses associated with the need to support many frequency bands in a single mobile device, etc.

Figure 1:
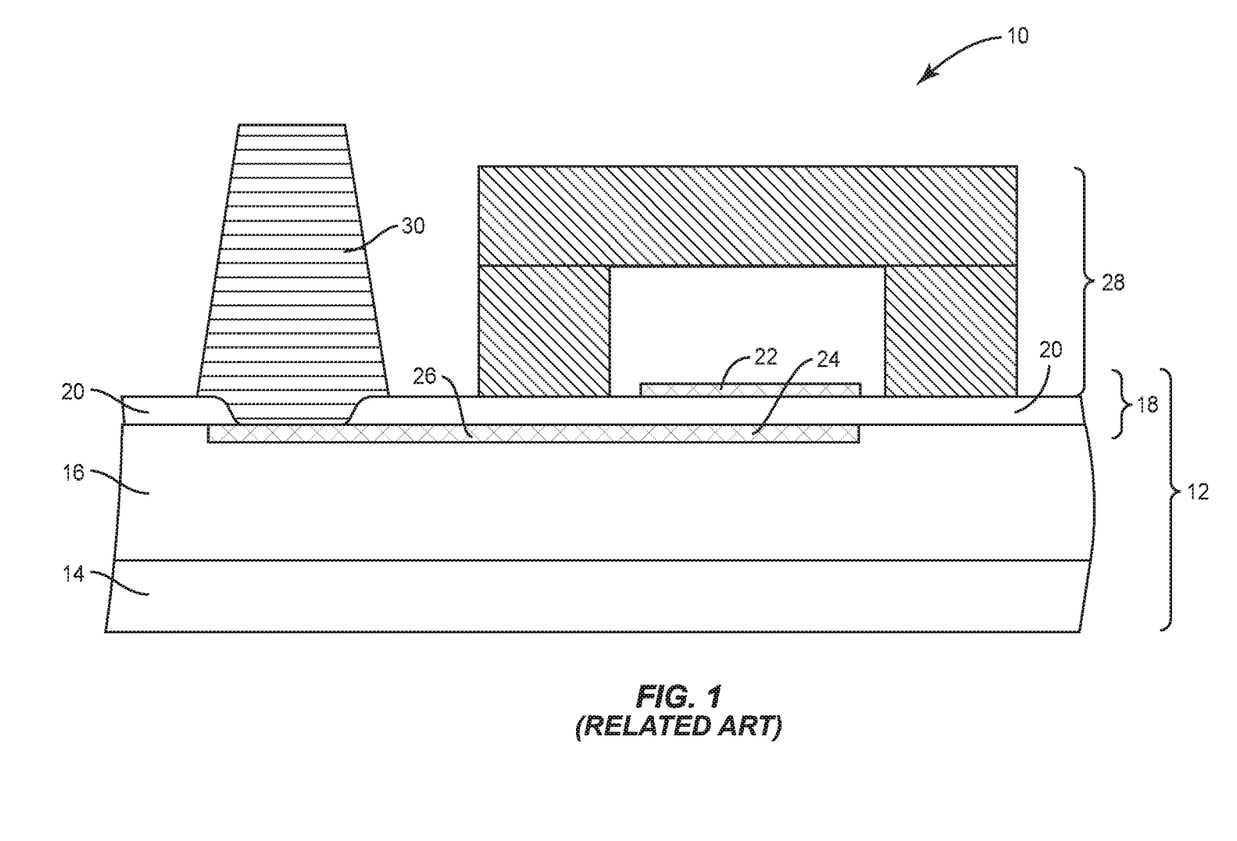
FIG. 1 provides a conventional Wafer-Level-Packaged (WLP) Bulk Acoustic Wave (BAW) device.

One example of a conventional Wafer-Level-Packaged (WLP) BAW device 10 is illustrated in FIG. 1. The BAW device 10 includes a BAW resonator 12 that has a substrate 14, a reflector 16 over the substrate 14, and a transducer 18 over the reflector 16. The reflector 16 is typically formed by a stack of reflector layers (not shown), which alternate in material composition to produce a significant reflection coefficient at the junction of adjacent reflector layers. The transducer 18 includes a piezoelectric layer 20, which is sandwiched between a top electrode 22 and a bottom electrode 24. The transducer 18 may also include a bottom electrode lead 26, which resides underneath the piezoelectric layer 20 and is connected to the bottom electrode 24.

In order to protect BAW resonators from external elements (such as moisture, contamination, etc.), housings, also known as WLP walls and caps, are applied to enclose the BAW resonators. In this example, the BAW device 10 includes a WLP enclosure 28, which is coupled to the piezoelectric layer 20 to encapsulate the top electrode 22 of the BAW resonator 12. In addition, the piezoelectric layer 20 has an opening outside the WLP enclosure 28, where a portion of the bottom electrode lead 26 is exposed through the opening of the piezoelectric layer 20. A copper pillar connection 30 is coupled to the exposed portion of the bottom electrode lead 26 to provide an external electrical connection for the BAW device 10.

Because of the processing constraints, there are space requirements between the WLP enclosure 28 and the copper pillar connection 30. In addition, the round shape of the copper pillar connection 30 will also take up a significant area of device space. As such, the opening of the piezoelectric layer 20 needs to be relatively far away from the WLP enclosure 28 to accommodate the copper pillar connection 30. If a BAW device has multiple BAW resonators and multiple copper pillar connections, the BAW device is associated with a large cross-sectional area. Accordingly, there remains a need for improved BAW device designs to reduce the device size without affecting the external electrical connection of the BAW device.

SUMMARY

The present disclosure relates to a wafer-level packaged (WLP) bulk acoustic wave (BAW) device, which includes a piezoelectric layer with a first interface opening, a bottom electrode, a bottom electrode lead extending from the bottom electrode, a first interface structure, a top electrode, a WLP enclosure with a first through-WLP via, and a first interconnect. The bottom electrode and the bottom electrode lead are formed over a bottom surface of the piezoelectric layer, and a portion of the bottom electrode lead is exposed through the first interface opening of the piezoelectric layer. The first interface structure extends over the first interface opening of the piezoelectric layer, and is in contact with the exposed portion of the bottom electrode lead. The top electrode is formed over a top surface of the piezoelectric layer, which is opposite the bottom surface of the piezoelectric layer. An active region for a resonator is formed where the bottom electrode and the top electrode overlap. The WLP enclosure includes a WLP cap and an outer wall. Herein, the outer wall extends from the WLP cap toward the top surface of the piezoelectric layer to form a cavity, and the top electrode resides in the cavity. The first through-WLP via extends vertically through the WLP cap and the outer wall, and is encompassed by the outer wall. The first through-WLP via of the WLP enclosure is vertically aligned with the first interface opening of the piezoelectric layer, and a portion of the first interface structure is exposed to the first through-WLP via. The first interconnect is formed in the first through-WLP via and electrically connected to the first interface structure.

According to another embodiment, the WLP BAW device further includes a passivation layer, which is directly over the top electrode and a portion of the top surface of the piezoelectric layer, such that a bottom surface of the outer wall is in contact with the passivation layer. Herein, the passivation layer has a first passivation opening that is vertically aligned between the first through-WLP via of the WLP enclosure and the first interface opening of the piezoelectric layer, such that the portion of the first interface structure is exposed to the first through-WLP via of the WLP enclosure through the first passivation opening of the passivation layer.

In one embodiment of the WLP BAW device, a width of the first passivation opening of the passivation layer is no greater than a width of the first interface opening of the piezoelectric layer. The width of the first interface opening of the piezoelectric layer is between 1.0 µm and 100 µm, and the width of the first passivation opening of the passivation layer is between 1 µm and 100 µm.

In one embodiment of the WLP BAW device, the passivation layer is formed of Silicon Nitride (SiN), $SiO_2$, or Silicon Oxynitride (SiON), with a thickness between 10 Å and 5000 Å.

According to another embodiment, the WLP BAW device further includes a first seed layer. Herein, the first seed layer continuously extends over exposed surfaces within the first through-WLP via, such that the first seed layer is in contact with the exposed portion of the first interface structure through the first passivation opening of the passivation layer. The first interconnect is formed over the first seed layer. The first seed layer is formed of Titanium (Ti) or Titanium Tungsten (TiW), and the first interconnect is formed of copper, Sn or SnAg.

In one embodiment of the WLP BAW device, the WLP cap has a height between 5 µm and 60 µm, and the outer wall has a thickness between 5 µm and 60 µm and a height between 5 µm and 60 µm.

In one embodiment of the WLP BAW device, the first interface structure includes a lower interface layer, a middle interface layer, and an upper interface layer. Herein, the lower interface layer extends over the first interface opening of the piezoelectric layer and is in contact with the exposed portion of the bottom electrode lead. The middle interface layer is formed over the lower interface layer, and the upper interface layer is formed over the middle interface layer. A portion of the upper interface layer is exposed to the first through-WLP via of the WLP enclosure and electrically connected to the first interconnect. The lower interface layer is formed of Tungsten (W) or Molybdenum (Mo) with a thickness between 100 Å and 10000 Å. The middle interface layer is formed of Aluminum Copper (AlCu) with a thickness between 100 Å and 10000 Å. The upper interface layer is formed of W or Mo or TiW with a thickness between 100 Å and 10000 Å. The bottom electrode and the bottom electrode lead are formed from a common first bottom electrode layer and a common second bottom electrode layer. Herein, the first bottom electrode layer is formed over the bottom surface of the piezoelectric layer, and a portion of the first bottom electrode layer is in contact with the lower interface layer of the first interface structure through the first interface opening of the piezoelectric layer. The first bottom electrode layer is formed of W or Mo with a thickness between 100 Å and 10000 Å. The second bottom electrode layer is formed underneath the first bottom electrode layer, and formed of AlCu with a thickness between 100 Å and 10000 Å.

In one embodiment of the WLP BAW device, the first interface structure includes a lower interface layer, a middle interface layer, and an upper interface layer. Herein, the lower interface layer extends over the first interface opening of the piezoelectric layer and is in contact with the exposed portion of the bottom electrode lead. The middle interface layer is formed over the lower interface layer and the upper interface layer that includes a layer opening formed over the middle interface layer. The layer opening of the upper interface layer is vertically aligned with the first passivation opening of the passivation layer, and has essentially a same size as the first passivation opening of the passivation layer. A portion of the middle interface layer is exposed to the first through-WLP via of the WLP enclosure through the first passivation opening of the passivation layer and the layer opening of the upper interface layer, and is electrically connected to the first interconnect. The lower interface layer is formed of W or Mo, the middle interface layer is formed of AlCu, and the upper interface layer is formed of W or Mo.

In one embodiment of the WLP BAW device, the first interface structure includes a lower interface layer, a middle interface layer, and an upper interface layer. Herein, the lower interface layer extends over the first interface opening of the piezoelectric layer and is in contact with the exposed portion of the bottom electrode lead. The middle interface layer with a first layer opening is formed over the lower interface layer, and the upper interface layer with a second layer opening is formed over the middle interface layer. The first layer opening of the middle interface layer and the second layer opening of the upper interface layer are vertically aligned with the first passivation opening of the passivation layer. The first layer opening of the middle interface layer and the second layer opening of the upper interface layer have essentially a same size as the first passivation opening of the passivation layer. A portion of the lower interface layer is exposed to the first through-WLP via of the WLP enclosure through the first passivation opening of the passivation layer, the second layer opening of the upper interface layer, and the first layer opening of the middle interface layer, and is electrically connected to the first interconnect. The lower interface layer is formed of W or Mo, the middle interface layer is formed of AlCu, and the upper interface layer is formed of W or Mo.

According to another embodiment, the WLP BAW device further includes a top electrode lead, a second interface structure, and a second interconnect. Herein, the piezoelectric layer further includes a second interface opening. The top electrode lead is formed over the top surface of the piezoelectric layer and extends from the top electrode. The second interface structure extends from the top electrode lead, and extends over the second interface opening of the piezoelectric layer. The WLP enclosure further includes a second through-WLP via, which extends through the WLP cap and the outer wall, and is encompassed by the outer wall. The second through-WLP via is vertically aligned with the second interface opening of the piezoelectric layer. A portion of the second interface structure is exposed to the second through-WLP via of the WLP enclosure. The second interconnect is formed in the second through-WLP via of the WLP enclosure and electrically connected to the second interface structure.

According to another embodiment, a WLP BAW device includes a piezoelectric layer with an interface opening, a bottom electrode, a top electrode, a top electrode lead extending from the top electrode, an interface structure, a WLP enclosure with a through-WLP via, and an interconnect. The bottom electrode is formed over a bottom surface of the piezoelectric layer. The top electrode and the top electrode lead are formed over a top surface of the piezoelectric layer, which is opposite the bottom surface of the piezoelectric layer. An active region for a resonator is formed where the bottom electrode and the top electrode overlap. The interface structure extends from the top electrode lead, and extends over the interface opening of the piezoelectric layer. The WLP enclosure includes a WLP cap and an outer wall. Herein, the outer wall extends from the WLP cap toward the top surface of the piezoelectric layer to form a cavity, and the top electrode resides in the cavity. The through-WLP via extends through the WLP cap and the outer wall, and is encompassed by the outer wall. The through-WLP via of the WLP enclosure is vertically aligned with the interface opening of the piezoelectric layer, and a portion of the interface structure is exposed to the through-WLP via. The interconnect is formed in the through-WLP via of the WLP enclosure and electrically connected to the interface structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-5B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2A:
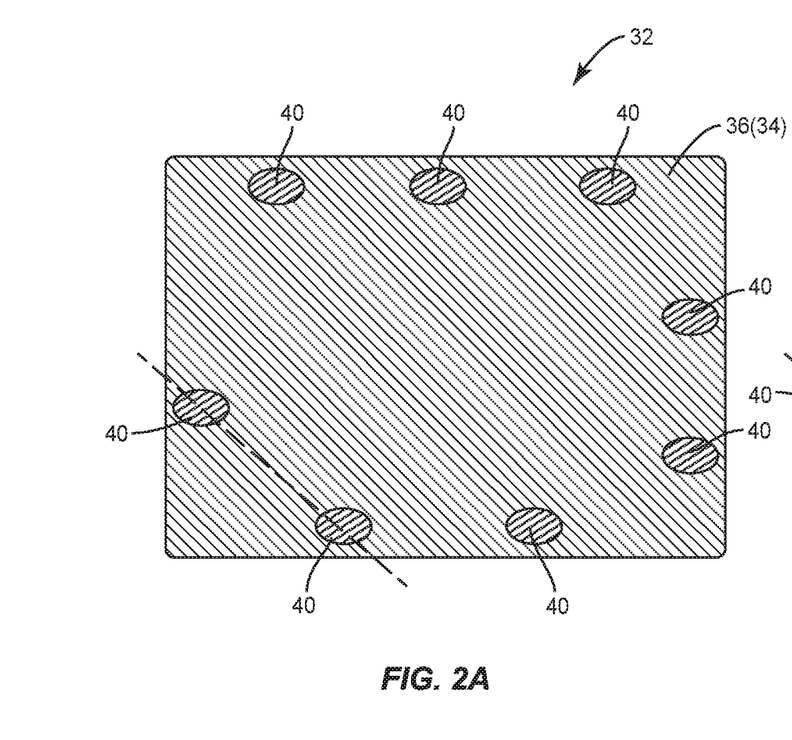
FIGS. 2A-2C provide an exemplary Wafer-Level-Packaged (WLP) BAW device according to one embodiment of the present disclosure.
Figure 2B:
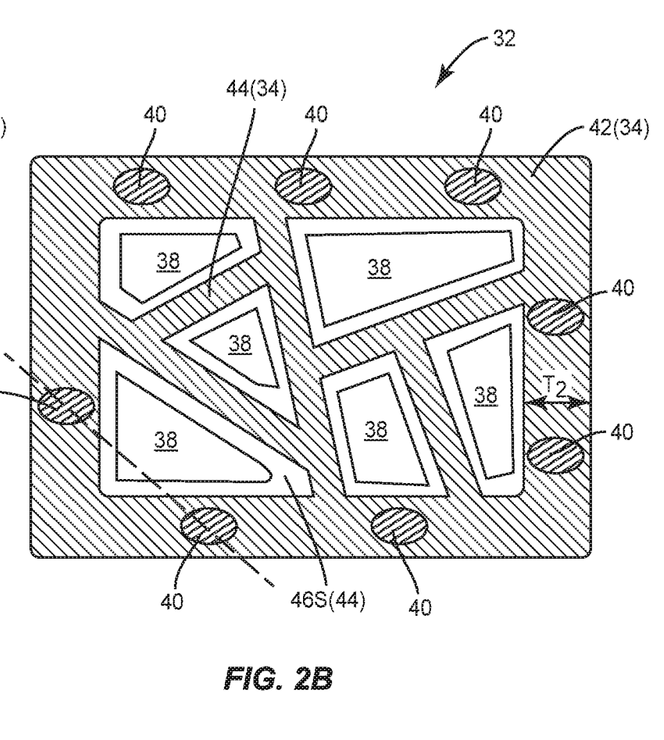
Figure 2C:
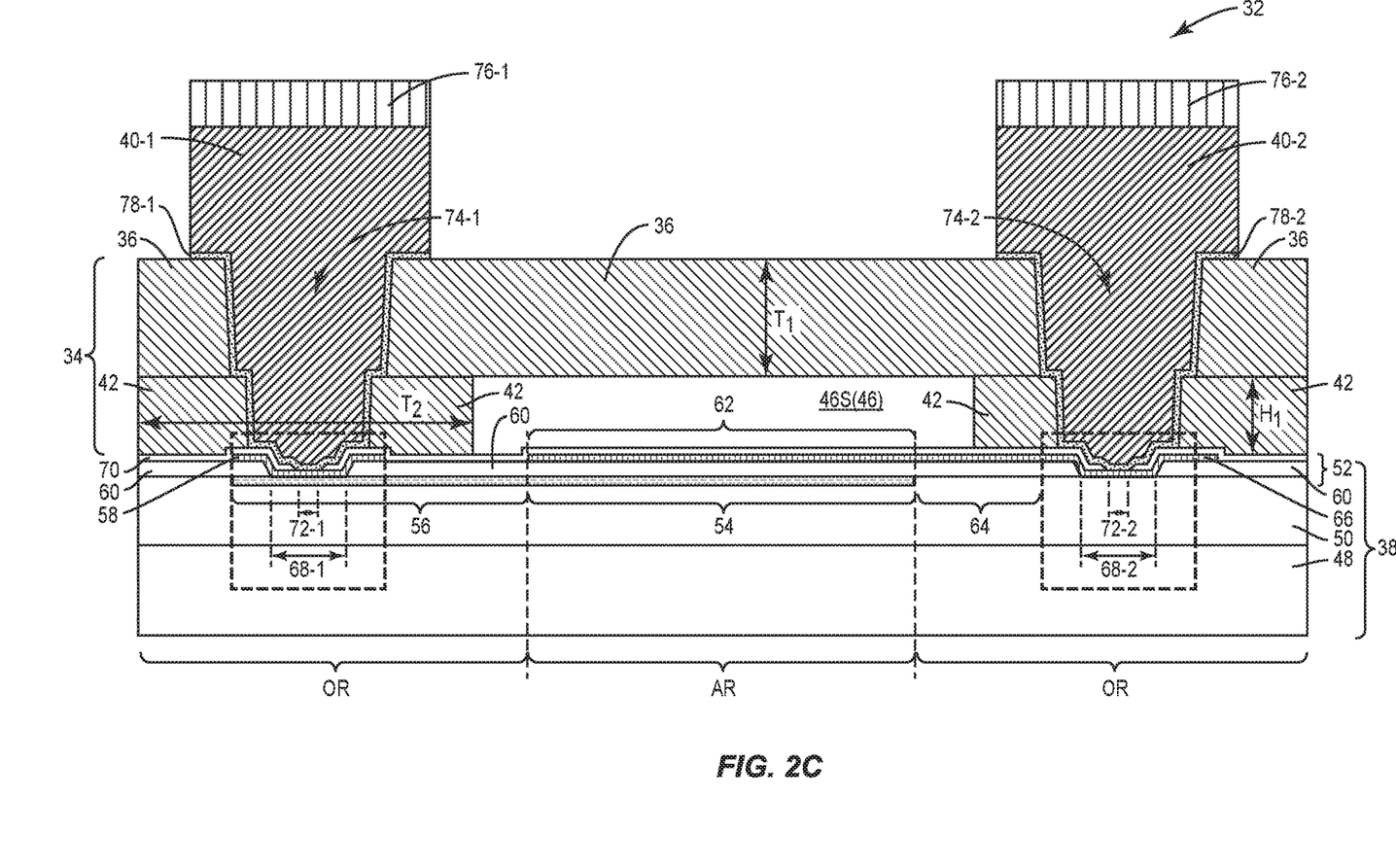

FIGS. 2A-2C provide an exemplary Wafer-Level-Packaged (WLP) Bulk Acoustic Wave (BAW) device 32 according to one embodiment of the present disclosure. FIG. 2A shows a top view of the WLP BAW device 32 with a WLP enclosure 34, FIG. 2B shows a top view of the WLP BAW device 32 under a WLP cap 36 of the WLP enclosure 34. For the purpose of this illustration, the WLP BAW device 32 includes six BAW resonators 38, eight interconnects 40, and the WLP enclosure 34. The WLP enclosure 34 includes the WLP cap 36, an outer wall 42, and inner walls 44 (only one inner wall is labeled with a reference number for clarity). The WLP cap 36 and the outer wall 42 form a large cavity 46, and the inner walls 44 divide the cavity 46 into six separate sub-cavities 46S (only two sub-cavities are labeled with reference numbers for clarity). Each BAW resonator 38 is encapsulated by the WLP enclosure 34 and resides in a corresponding sub-cavity 46S. Some BAW resonators 38 may be electrically connected, and some BAW resonators 38 may be electrically separated from others. Each interconnect 40 extends through the WLP cap 36 and the outer wall 42 (encompassed by the outer wall 42), and is electrically connected to a corresponding BAW resonator 38 (more details are described later). In different applications, the WLP BAW device 34 may include fewer or more BAW resonators, and may include fewer or more interconnects. If there is only one BAW resonator 38 in the WLP BAW device 32, the inner walls 44 of the WLP enclosure may be omitted.

FIG. 2C shows a cross-sectional view (along the dashed line in FIGS. 2A and 2B) of the WLP BAW device 32. The BAW resonator 38 includes a substrate 48, a reflector region 50 over the substrate 48, and a transducer region 52 over the reflector region 50. The substrate 48 may be formed of Silicon (Si). The reflector region 50 includes multiple alternating layers (not shown) of alternating materials with varying refractive index. In this embodiment, these multiple alternating layers may be formed of Silicon Dioxide ($SiO_2$) and Tungsten (W). The transducer region 52 includes a bottom electrode 54, a bottom electrode lead 56, a first interface structure 58, a piezoelectric layer 60, a top electrode 62, a top electrode lead 64, and a second interface structure 66.

The bottom electrode 54 and the bottom electrode lead 56 are connected together, and formed on a bottom surface of the piezoelectric layer 60. The top electrode 62 and the top electrode lead 64 are connected together, and formed on a top surface of the piezoelectric layer 60. Herein, the top surface of the piezoelectric layer 60 is opposite the bottom surface of the piezoelectric layer 60. An active region AR for the BAW resonator 38 is formed where the bottom electrode 54 and the top electrode 62 overlap, and also includes the layers between and below the overlapping top and bottom electrodes 54 and 62. Other sections of the BAW resonator 38 that surround the active region AR are outside regions OR. The bottom electrode lead 56 and the top electrode lead 64 reside within the outside regions OR. In operation, acoustic waves in the piezoelectric layer 60 within the active region AR of the BAW resonator 38 are excited by an electrical signal applied to the bottom and top electrodes 54 and 62. The frequency at which resonance of the acoustic waves occurs is a function of the thickness of the reflector region 50, the piezoelectric layer 60, and the mass of the bottom and top electrodes 54 and 62.

In this embodiment, the piezoelectric layer 60 has eight interface openings 68 for the eight interconnects 40, which provide external electrical connections for the BAW resonator 38 (FIG. 2C only shows a first interface opening 68-1 and a second interface opening 68-2). A portion of the bottom electrode lead 56 is exposed through the first interface opening 68-1 of the piezoelectric layer 60. The first interface structure 58 extends over the first interface opening 68-1 and is in contact with the exposed portion of the bottom electrode lead 56. In some applications, the first interface structure 58 may cover exposed surfaces of the piezoelectric layer 60 within the first interface opening 68-1, and extend to the top surface of the piezoelectric layer 60. The second interface structure 66 extends from the top electrode lead 64 and extends over the second interface opening 68-2. In some applications, the second interface structure 66 may cover exposed surfaces within the second interface opening 68-2 and extend to the top surface of the piezoelectric layer 60. The first interface structure 58 and the second interface structure 66 reside within the outside regions OR.

A passivation layer 70 may be formed over both the active region AR and the outside regions OR of the BAW resonator 38. Herein, the passivation layer 70 fully covers the top electrode 62, the top electrode lead 64, and exposed portions of the top surface of the piezoelectric layer 60 (through the top electrode 62, the top electrode lead 64, the first interface structure 58, and the second interface structure 66). However, the passivation layer 70 does not fully cover the first interface structure 58 or the second interface structure 66. In this embodiment, the passivation layer 70 has eight passivation openings 72, each of which is vertically aligned and above a corresponding interface opening 68 of the piezoelectric layer 60 (FIG. 2C only shows a first passivation opening 72-1 and a second passivation opening 72-2). A portion of the first interface structure 58, which is formed over the first interface opening 68-1, is exposed through the first passivation opening 72-1. A portion of the second interface structure 66, which is formed over the second interface opening 68-2, is exposed through the second passivation opening 72-2. A width (i.e., diameter) of each passivation opening 72 is no greater than a width (i.e., diameter) of each interface opening 68. The width of each passivation opening 72 is between 1.0 µm and 100 µm, and the width of each interface opening 68 is between 1.0 µm and 100 µm. The passivation layer 70 may be formed of Silicon Nitride (SiN), $SiO_2$, or Silicon Oxynitride (SiON), with a thickness between 10 Å and 5000 Å.

The outer wall 42 of the WLP enclosure 34 extends from the WLP cap 36 toward the top surface of the piezoelectric layer 60 to form the large cavity 46, and the inner walls 44 extend from the WLP cap 36 toward the top surface of the piezoelectric layer 60 to divide the large cavity 46 into separate sub-cavities 46S. If the WLP BAW device 32 includes the passivation layer 70, a bottom surface of the outer wall 42 and a bottom surface of each inner wall 44 (not shown in FIG. 2C) are in contact with the passivation layer 70. The top electrode 62 of the BAW resonator 38 resides in the corresponding sub-cavity 46S. The WLP enclosure 34 may be formed of TMMF, SU-8, or photo-definable epoxies. The WLP cap 36 has a height H1 between 5 µm and 60 µm, and the outer wall 42 has a thickness T1 between 5 µm and 60 µm and a height H2 between 5 µm and 60 µm.

In this embodiment, the WLP enclosure 34 also includes eight through-WLP vias 74 extending through the WLP cap 36 and the outer wall 42. Herein, each through-WLP via 74 is encompassed by the outer wall 42, and is vertically aligned with a corresponding passivation opening 72/interface opening 68 (only a first through-WLP via 74-1 and a second through-WLP via 74-2 are shown in FIG. 2C). A portion of the first interface structure 58 (through the first passivation opening 72-1) is exposed at the bottom of the first through-WLP via 74-1, while a portion of the second interface structure 66 (through the second passivation opening 72-2) is exposed at the bottom of the second through-WLP via 74-2. In some applications, portions of the passivation layer 70 around the first passivation opening 72-1 may also be exposed at the bottom of the first through-WLP via 74-1, and portions of the passivation layer 70 around the second passivation opening 72-2 may also be exposed at the bottom of the second through-WLP via 74-2.

Each interconnect 40 extends through the WLP cap 36 and the outer wall 42, and fills the corresponding through-WLP via 74 (only a first interconnect 40-1 and a second interconnect 40-2 are shown in FIG. 2C). Herein, the first interconnect 40-1 fills the first through-WLP via 74-1 and is electrically connected to the first interface structure 58, which extends over the first interface opening 68-1 of the piezoelectric layer 60 and is exposed through the first passivation opening 72-1 of the passivation layer 70. The second interconnect 40-2 fills the second through-WLP via 74-2 and is electrically connected to the second interface structure 66, which extends over the second interface opening 68-2 of the piezoelectric layer 60 and is exposed through the second passivation opening 72-2 of the passivation layer 70. Unlike the conventional WLP BAW device 10 shown in FIG. 1, the WLP BAW device 32 does not require extra space between the outer wall 42 of the WLP enclosure 34 and the interconnects 40 for external connections. Instead, each interconnect 40 is confined within the outer wall 42. Consequently, the size of the WLP BAW device 32 will be reduced compared to the conventional WLP BAW device 10. In some applications, a portion of each interconnect 40 may reside over the WLP cap 36 and there is a solder cap 76 formed over the corresponding interconnect 40 (only a first solder cap 76-1 and a second solder cap 76-2 are shown in FIG. 2C). The solder cap 76 may be formed of Tin (Sn).

In order to improve deposition of the interconnects 40, there may be a continuous seed layer 78 formed for each interconnect 40 (only a first seed layer 78-1 and a second seed layer 78-2 are shown in FIG. 2C). The first seed layer 78-1 continuously extends over exposed surfaces within the first through-WLP via 74-1, such that the first seed layer 78-1 is in contact with exposed surfaces of the WLP enclosure 34 within the first through-WLP via 74-1, in contact with the exposed portions of the passivation layer 70 at the bottom of the first through-WLP via 74-1, and in contact with the exposed portion of the first interface structure 58 at the bottom of the first through-WLP via 74-1. The first interconnect 40-1 is formed over the first seed layer 78-1, such that the first interconnect 40-1 is electrically connected to the first interface structure 58 through the first seed layer 78-1. The second seed layer 78-2 continuously extends over exposed surfaces within the second through-WLP via 74-2, such that the second seed layer 78-2 is in contact with exposed surfaces of the WLP enclosure 34 within the second through-WLP via 74-2, in contact with the exposed portions of the passivation layer 70 at the bottom of the second through-WLP via 74-2, and in contact with the exposed portion of the second interface structure 66 at the bottom of the second through-WLP via 74-2. The second interconnect 40-2 is formed over the second seed layer 78-2, such that the second interconnect 40-2 is electrically connected to the second interface structure 66 through the second seed layer 78-2. If there is no seed layer 78, each interconnect 40 will be directly connected to the corresponding interface structure. The seed layer 78 may be formed of Titanium (Ti) or Titanium Tungsten (TiW). The interconnects 40 may be formed of copper (Cu), Sn, or Tin Silver (SnAg).

In one embodiment, the transducer region 52 of the BAW resonator 38 may not include the first interface structure 58. The bottom electrode 54 may be connected to another bottom electrode in an adjacent sub-cavity 46S by the bottom electrode lead 56 (not shown). As such, there is no first interconnect 40-1 needed to provide an external electrical connection for the bottom electrode 54. Consequently, there is no first through-WLP via 74-1 through the WLP cap 36 and the outer wall 42, and there is no first seed layer 78-1 that extends over exposed surfaces within the first through-WLP via 74-1. In another embodiment, the transducer region 52 of the BAW resonator 38 may not include the second interface structure 66. The top electrode 62 may be connected to another top electrode in an adjacent sub-cavity 46S by the top electrode lead 64 (not shown). As such, there is no second interconnect 40-2 needed to provide an external electrical connection for the top electrode 62. Consequently, there is no second through-WLP via 74-2 through the WLP cap 36 and the outer wall 42, and there is no second seed layer 78-2 that extends over exposed surfaces within the second through-WLP via 74-2.

Figure 3A:
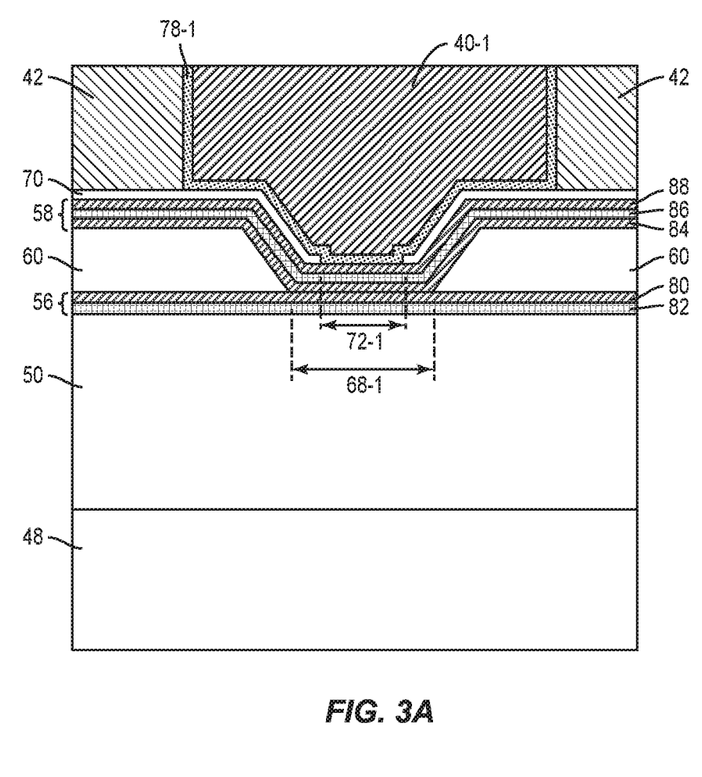
FIGS. 3A-3B provide layer-level details of connection configurations within the WLP BAW device shown in FIG. 2C.
Figure 3B:
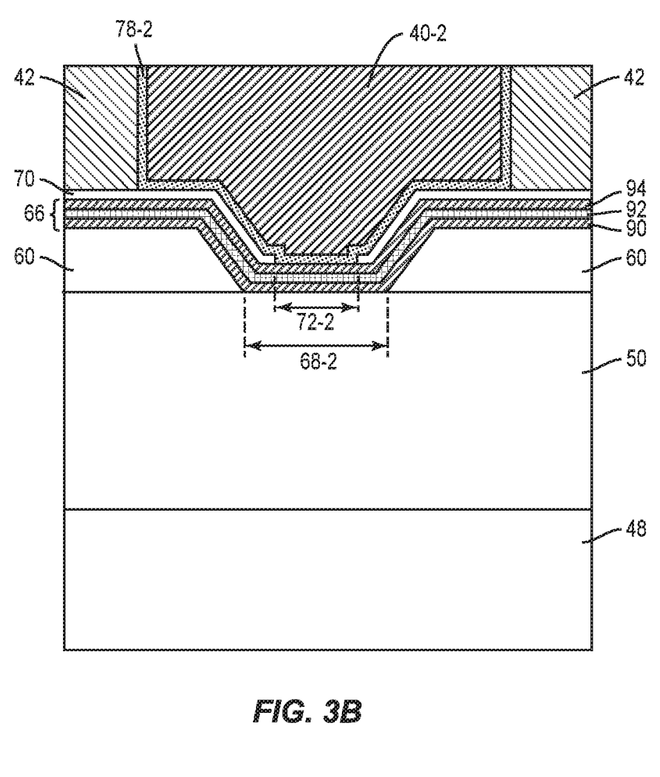

FIGS. 3A-3B provide layer-level details of connection configurations within dashed boxes of the WLP BAW device 32 shown in FIG. 2C. FIG. 3A illustrates the connection configurations around the first interface structure 58. Herein, the bottom electrode 54 (not shown in FIG. 3A) and the bottom electrode lead 56 are formed from a common first bottom electrode layer 80 and a common second bottom electrode layer 82. The first bottom electrode layer 80 is formed over the bottom surface of the piezoelectric layer 60, and a portion of the first bottom electrode layer 80 is exposed through the first interface opening 68-1. The second bottom electrode layer 82 is formed between the first bottom electrode layer 80 and the reflector region 50. In addition, there may be a bottom seed layer (not shown) formed between the first bottom electrode layer 80 and the second bottom electrode layer 82. The first bottom electrode layer 80 may be formed of W, Molybdenum (Mo), or other electrically conductive materials with a high acoustic impedance property, and the second bottom electrode layer 82 may be formed of Aluminum Copper (AlCu) or other highly electrically conductive materials. The first bottom electrode layer 80 has a thickness between 100 Å and 10000 Å, and the second bottom electrode layer 82 has a thickness between 100 Å and 10000 Å.

The first interface structure 58 includes a lower interface layer 84, a middle interface layer 86, and an upper interface layer 88. The lower interface layer 84 extends over the first interface opening 68-1 and is in contact with the exposed portion of the first bottom electrode layer 80 through the first interface opening 68-1. In some applications, the lower interface layer 84 may cover the exposed surfaces of the piezoelectric layer 60 within the first interface opening 68-1, and may extend to the top surface of the piezoelectric layer 60. The middle interface layer 86 is formed over the lower interface layer 84, the upper interface layer 88 is formed over the middle interface layer 86, and the passivation layer 70 is over the upper interface layer 88. In addition, a portion of the upper interface layer 88 is exposed to the first through-WLP via 74-1 of the WLP enclosure 34 through the first passivation opening 72-1 of the passivation layer 70. As such, the first seed layer 78-1 or the first interconnect 40-1 (if there is no seed layer) is in contact with the exposed portion of the upper interface layer 88. The lower interface layer 84 may be formed of W or Mo with a thickness between 100 Å and 10000 Å, the middle interface layer 86 may be formed of AlCu with a thickness between 100 Å and 10000 Å, and the upper interface layer 88 may be formed of W or Mo with a thickness between 100 Å and 10000 Å.

FIG. 3B illustrates the connection configurations around the second interface structure 66. Herein, the top electrode 62 (not shown in FIG. 3B), the top electrode lead 64 (not shown in FIG. 3B), and the second interface structure 66 are formed from a common first top electrode layer 90, a common second top electrode layer 92, and a common third top electrode layer 94. The first top electrode layer 90 extends over a portion of the top surface of the piezoelectric layer 60 (at least for the top electrode 62 and the top electrode lead 64), and over exposed surfaces of the piezoelectric layer 60 within the second interface opening 68-2. The second top electrode layer 92 is formed over the first top electrode layer 90, the third top electrode layer 94 is formed over the second top electrode layer 92, and the passivation layer 70 is over the third top electrode layer 94. In addition, a portion of the third top electrode layer 94 is exposed to the second through-WLP via 74-2 of the WLP enclosure 34 through the second passivation opening 72-2 of the passivation layer 70. As such, the second seed layer 78-2 or the second interconnect 40-2 (if there is no seed layer) is in contact with the exposed portion of the third top electrode layer 94. The first top electrode layer 90 may be formed of W or Mo with a thickness between 100 Å and 10000 Å, the second top electrode layer 92 may be formed of AlCu with a thickness between 100 Å and 10000 Å, and the third top electrode layer 94 may be formed of W or Mo with a thickness between 100 Å and 10000 Å.

Figure 4A:
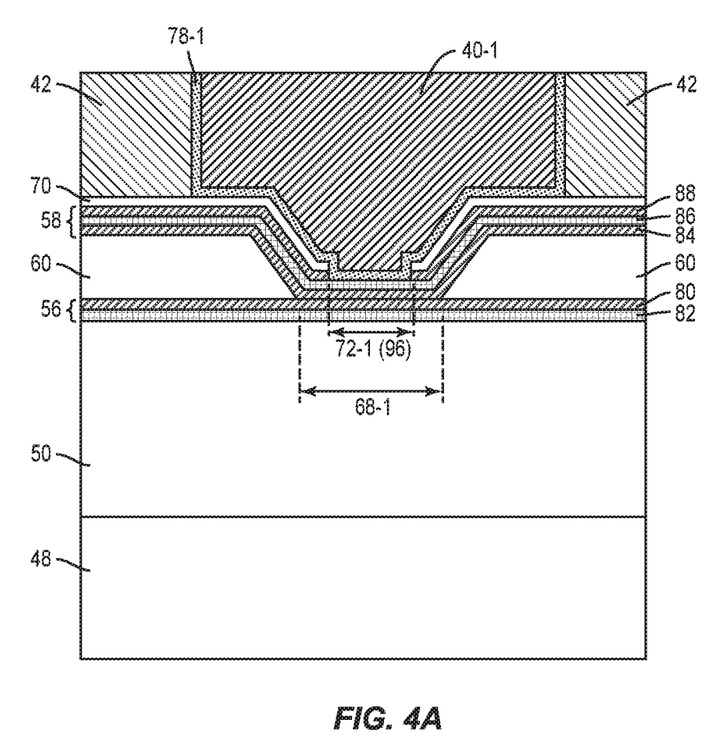
FIGS. 4A-4B provide alternative layer-level details of connection configurations within the WLP BAW device shown in FIG. 2C.
Figure 4B:
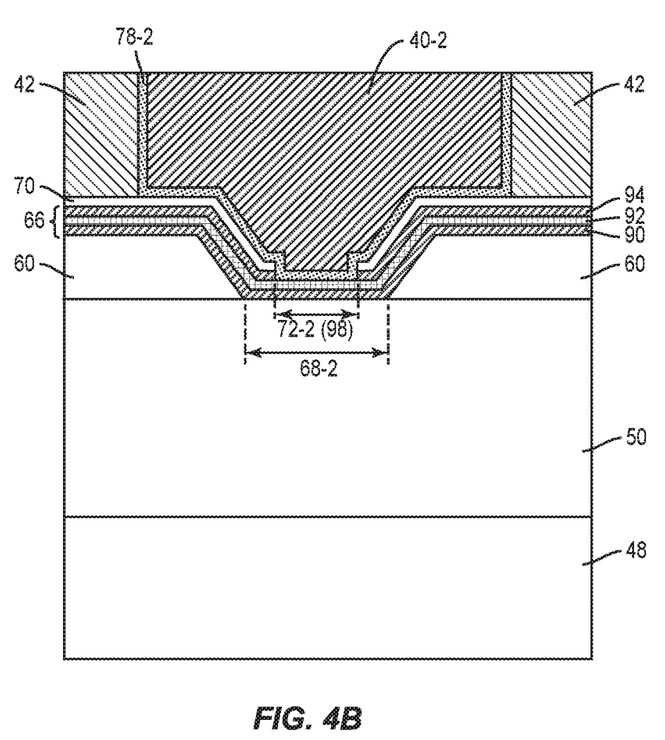

FIGS. 4A-4B provide alternative layer-level details of connection configurations within the dashed boxes of the WLP BAW device 32 shown in FIG. 2C. The first interface structure 58 still includes the lower interface layer 84, the middle interface layer 86, and the upper interface layer 88. Herein, the upper interface layer 88 includes a first layer opening 96 vertically aligned with the first passivation opening 72-1 of the passivation layer 70. The first layer opening 96 of the upper interface layer 88 has essentially a same size as the first passivation opening 72-1 of the passivation layer 70. As such, a portion of the middle interface layer 86 is exposed to the first through-WLP via 74-1 of the WLP enclosure 34 through the first passivation opening 72-1 of the passivation layer 70 and the first layer opening 96 of the upper interface layer 88. Consequently, the first seed layer 78-1 or the first interconnect 40-1 (if there is no seed layer) is in contact with the exposed portion of the middle interface layer 86.

Similarly, the third top electrode layer 94 of the second interface structure 66 includes a second layer opening 98 vertically aligned with the second passivation opening 72-2 of the passivation layer 70. The second layer opening 98 of the third top electrode layer 94 is essentially a same size as the second passivation opening 72-2 of the passivation layer 70. As such, a portion of the second top electrode layer 92 is exposed to the second through-WLP via 74-2 of the WLP enclosure 34 through the second passivation opening 72-2 of the passivation layer 70 and the second layer opening 98 of the third top electrode layer 94. Consequently, the second seed layer 78-2 or the second interconnect 40-2 (if there is no seed layer) is in contact with the exposed portion of the second top electrode layer 92.

Figure 5A:
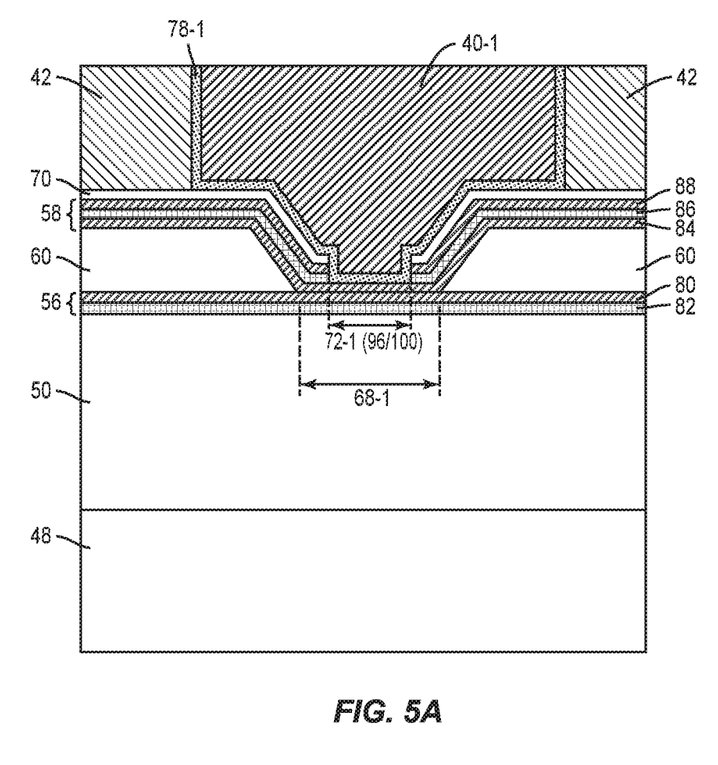
FIGS. 5A-5B provide alternative layer-level details of connection configurations within the WLP BAW device shown in FIG. 2C.

In another embodiment, the upper interface layer 88 and the middle interface layer 86 of the first interface structure 58 have the first layer opening 96 and a third layer opening 100, respectively, as illustrated in FIG. 5A. The first layer opening 96 of the upper interface layer 88 and the third layer opening 100 of the middle interface layer 86 are vertically aligned with the first passivation opening 72-1 of the passivation layer 70, and have essentially the same size as the first passivation opening 72-1 of the passivation layer 70. As such, a portion of the lower interface layer 84 is exposed to the first through-WLP via 74-1 of the WLP enclosure 34 through the first passivation opening 72-1 of the passivation layer 70, the first layer opening 96 of the upper interface layer 88, and the third layer opening 100 of the middle interface layer 86. Consequently, the first seed layer 78-1 or the first interconnect 40-1 (if there is no seed layer) is in contact with the exposed portion of the lower interface layer 84.

Figure 5B:
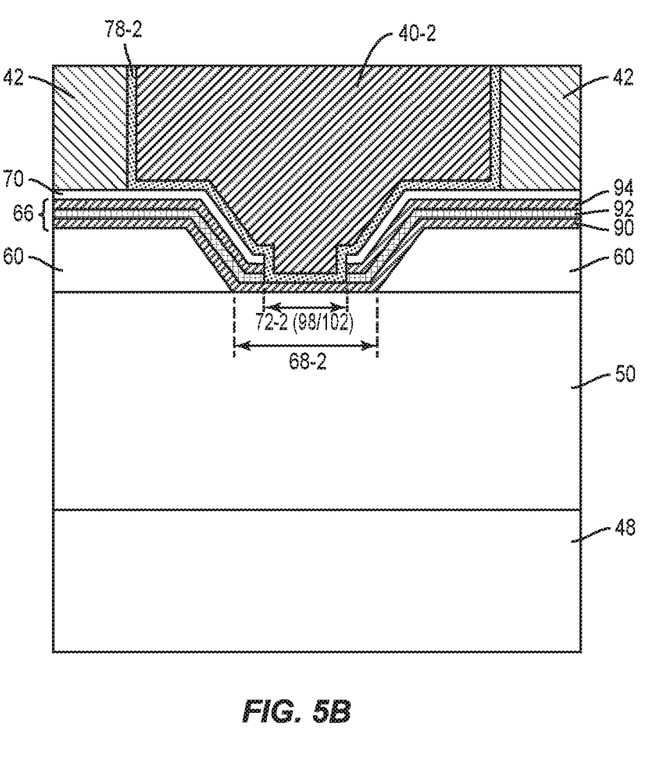

In FIG. 5B, the third top electrode layer 94 and the second top electrode layer 92 of the second interface structure 66 have the second layer opening 98 and a fourth layer opening 102, respectively. The second layer opening 98 of the third top electrode layer 94 and the fourth layer opening 102 of the second top electrode layer 92 are vertically aligned with the second passivation opening 72-2 of the passivation layer 70, and have essentially the same size as the second passivation opening 72-2 of the passivation layer 70. As such, a portion of the first top electrode layer 90 is exposed to the second through-WLP via 74-2 of the WLP enclosure 34 through the second passivation opening 72-2 of the passivation layer 70, the second layer opening 98 of the third top electrode layer 94, and the fourth layer opening 102 of the second top electrode layer 92. Consequently, the second seed layer 78-2 or the second interconnect 40-2 (if there is no seed layer) is in contact with the exposed portion of the first top electrode layer 90.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
    a piezoelectric layer with a first interface opening;
    a bottom electrode over a bottom surface of the piezoelectric layer;
    a bottom electrode lead over the bottom surface of the piezoelectric layer and extending from the bottom electrode, wherein a portion of the bottom electrode lead is exposed through the first interface opening of the piezoelectric layer;
    a first interface structure extending over the first interface opening and in contact with the exposed portion of the bottom electrode lead;
    a top electrode over a top surface of the piezoelectric layer, wherein:
        the top surface of the piezoelectric layer is opposite the bottom surface of the piezoelectric layer; and
        an active region for a resonator is formed where the bottom electrode and the top electrode overlap;
    a Wafer-Level-Packaged (WLP) enclosure comprising a WLP cap, an outer wall, and a first through-WLP via, wherein:
        the outer wall extends from the WLP cap toward the top surface of the piezoelectric layer to form a cavity, and the top electrode resides in the cavity;
        the first through-WLP via extends vertically through the WLP cap and the outer wall, and is encompassed by the outer wall; and
        the first through-WLP via of the WLP enclosure is vertically aligned with the first interface opening of the piezoelectric layer, and a portion of the first interface structure is exposed to the first through-WLP via;
    a passivation layer over the top electrode and the top surface of the piezoelectric layer, such that a bottom surface of the outer wall is in contact with the passivation layer, wherein the passivation layer has a first passivation opening that is vertically aligned between the first through-WLP via of the WLP enclosure and the first interface opening of the piezoelectric layer, such that the portion of the first interface structure is exposed to the first through-WLP via of the WLP enclosure through the first passivation opening of the passivation layer; and
    a first interconnect formed in the first through-WLP via and electrically connected to the first interface structure.

2. The apparatus of claim 1 wherein the passivation layer is directly over the top electrode and a portion of the top surface of the piezoelectric layer.

3. The apparatus of claim 2 wherein a width of the first passivation opening of the passivation layer is no greater than a width of the first interface opening of the piezoelectric layer.

4. The apparatus of claim 3 wherein the width of the first interface opening of the piezoelectric layer is between 1.0 μm and 100 μm.

5. The apparatus of claim 3 wherein the width of the first passivation opening of the passivation layer is between 1.0 μm and 100 μm.

6. The apparatus of claim 2 wherein the first interface structure comprises a lower interface layer, a middle interface layer, and an upper interface layer, wherein:
    the lower interface layer extends over the first interface opening of the piezoelectric layer and is in contact with the exposed portion of the bottom electrode lead;
    the middle interface layer is formed over the lower interface layer, and the upper interface layer with a layer opening formed over the middle interface layer;
    the layer opening of the upper interface layer is vertically aligned with the first passivation opening of the passivation layer, and has essentially a same size as the first passivation opening of the passivation layer;
    a portion of the middle interface layer is exposed to the first through-WLP via of the WLP enclosure through the first passivation opening of the passivation layer and the layer opening of the upper interface layer, and is electrically connected to the first interconnect; and the lower interface layer is formed of W or Mo, the middle interface layer is formed of AlCu, and the upper interface layer is formed of W or Mo.

7. The apparatus of claim 2 wherein the first interface structure comprises a lower interface layer, a middle interface layer, and an upper interface layer, wherein:

the lower interface layer extends over the first interface opening of the piezoelectric layer and is in contact with the exposed portion of the bottom electrode lead;

the middle interface layer with a first layer opening is formed over the lower interface layer, and the upper interface layer with a second layer opening is formed over the middle interface layer;

the first layer opening of the middle interface layer and the second layer opening of the upper interface layer are vertically aligned with the first passivation opening of the passivation layer;

the first layer opening of the middle interface layer and the second layer opening of the upper interface layer have essentially a same size as the first passivation opening of the passivation layer;

a portion of the lower interface layer is exposed to the first through-WLP via of the WLP enclosure through the first passivation opening of the passivation layer, the second layer opening of the upper interface layer, and the first layer opening of the middle interface layer, and is electrically connected to the first interconnect; and the lower interface layer is formed of W or Mo, the middle interface layer is formed of AlCu, and the upper interface layer is formed of W or Mo.

8. The apparatus of claim 1 wherein the passivation layer is formed of Silicon Nitride (SiN), $SiO_2$, or Silicon Oxynitride (SiON), with a thickness between 10 Å and 5000 Å.

9. The apparatus of claim 1 further comprising a first seed layer, wherein:

the first seed layer continuously extends over exposed surfaces within the first through-WLP via, such that the first seed layer is in contact with the exposed portion of the first interface structure through the first passivation opening of the passivation layer; and the first interconnect is formed over the first seed layer.

10. The apparatus of claim 9 wherein the first seed layer is formed of Titanium (Ti) or Titanium Tungsten (TiW).

11. The apparatus of claim 1 wherein the WLP cap has a height between 5 μm and 60 μm, and the outer wall has a thickness between 5 μm and 60 μm and a height between 10 μm and 60 μm.

12. The apparatus of claim 1 wherein the first interconnect is formed of copper (Cu), Tin (Sn), or Tin Silver (SnAg).

13. The apparatus of claim 1 further comprising a top electrode lead, a second interface structure, and a second interconnect, wherein:

the piezoelectric layer further includes a second interface opening;

the top electrode lead is formed over the top surface of the piezoelectric layer and extends from the top electrode;

the second interface structure extends from the top electrode lead, and extends over the second interface opening of the piezoelectric layer;

the WLP enclosure further includes a second through-WLP via, wherein the second through-WLP via extends through the WLP cap and the outer wall, is encompassed by the outer wall, and is vertically aligned with the second interface opening of the piezoelectric layer;

a portion of the second interface structure is exposed to the second through-WLP via of the WLP enclosure; and the second interconnect formed in the second through-WLP via of the WLP enclosure and is electrically connected to the second interface structure.

14. The apparatus of claim 13 further comprising the passivation layer with a second passivation opening, wherein:

the passivation layer is over the top electrode, the top electrode lead, and the top surface of the piezoelectric layer, such that the bottom surface of the outer wall is in contact with the passivation layer; and the second passivation opening is vertically aligned between the second through-WLP via of the WLP enclosure and the second interface opening of the piezoelectric layer, such that the portion of the second interface structure is exposed to the second through-WLP via of the WLP enclosure through the second passivation opening of the passivation layer.

15. The apparatus of claim 14 further comprising a first seed layer and a second seed layer, wherein:

the first seed layer continuously extends over exposed surfaces within the first through-WLP via, such that the first seed layer is in contact with the exposed portion of the first interface structure through the first passivation opening of the passivation layer;

the first interconnect is formed over the first seed layer;

the second seed layer continuously extends over exposed surfaces within the second through-WLP via, such that the second seed layer is in contact with the exposed portion of the second interface structure through the second passivation opening of the passivation layer; and the second interconnect is formed over the second seed layer.

16. The apparatus of claim 13 wherein:

the first interface structure includes a lower interface layer, a middle interface layer, and an upper interface layer, wherein:

the lower interface layer extends over the first interface opening and is in contact with the exposed portion of the bottom electrode lead;

the middle interface layer is formed over the lower interface layer, and the upper interface layer is formed over the middle interface layer;

a portion of the upper interface layer is exposed to the first through-WLP via of the WLP enclosure and electrically connected to the first interconnect; and the lower interface layer is formed of W or Mo, the middle interface layer is formed of AlCu, and the upper interface layer is formed of W or Mo;

the bottom electrode and the bottom electrode lead are formed from a common first bottom electrode layer and a common second bottom electrode layer, wherein:

the first bottom electrode layer is formed over the bottom surface of the piezoelectric layer, and a portion of the first bottom electrode layer is in contact with the lower interface layer of the first interface structure through the first interface opening of the piezoelectric layer;

the second bottom electrode layer is formed underneath the first bottom electrode layer; and the first bottom electrode layer is formed of W or Mo, and the second bottom electrode layer is formed of AlCu, and the top electrode, the top electrode lead, and the second interface structure are formed from a common first top electrode layer, a common second top electrode layer, and a common third top electrode layer, wherein:
  the first top electrode layer extends over a portion of the top surface of the piezoelectric layer and over the second interface opening;
  the second top electrode layer is formed over the first top electrode layer, and the third top electrode layer is formed over the second top electrode layer;
  a portion of the third top electrode layer is exposed to the second through-WLP via of the WLP enclosure and electrically connected to the second interconnect; and
  the first top electrode layer is formed of W or Mo, the second top electrode layer is formed of AlCu, and the third top electrode layer is formed of W or Mo.

17. An apparatus comprising:
a piezoelectric layer with a first interface opening;
a bottom electrode over a bottom surface of the piezoelectric layer;
a bottom electrode lead over the bottom surface of the piezoelectric layer and extending from the bottom electrode, wherein a portion of the bottom electrode lead is exposed through the first interface opening of the piezoelectric layer;
a first interface structure extending over the first interface opening and in contact with the exposed portion of the bottom electrode lead, wherein the first interface structure comprises a lower interface layer, a middle interface layer, and an upper interface layer, wherein:
  the lower interface layer extends over the first interface opening of the piezoelectric layer and is in contact with the exposed portion of the bottom electrode lead;
  the middle interface layer is formed over the lower interface layer, and the upper interface layer is formed over the middle interface layer; and
  the lower interface layer is formed of Tungsten (W) or Molybdenum (Mo), the middle interface layer is formed of Aluminum Copper (AlCu), and the upper interface layer is formed of W or Mo;
a top electrode over a top surface of the piezoelectric layer, wherein:
  the top surface of the piezoelectric layer is opposite the bottom surface of the piezoelectric layer; and
  an active region for a resonator is formed where the bottom electrode and the top electrode overlap;
a Wafer-Level-Packaged (WLP) enclosure comprising a WLP cap, an outer wall, and a first through-WLP via, wherein:
  the outer wall extends from the WLP cap toward the top surface of the piezoelectric layer to form a cavity, and the top electrode resides in the cavity;
  the first through-WLP via extends vertically through the WLP cap and the outer wall, and is encompassed by the outer wall; and
  the first through-WLP via of the WLP enclosure is vertically aligned with the first interface opening of the piezoelectric layer, and a portion of the upper interface layer of the first interface structure is exposed to the first through-WLP via; and
a first interconnect formed in the first through-WLP via and electrically connected to the first interface structure.

18. The apparatus of claim 17 wherein:
the lower interface layer has a thickness between 100 Å and 10000 Å;
the middle interface layer has a thickness between 100 Å and 10000 Å; and
the upper interface layer has a thickness between 100 Å and 10000 Å.

19. The apparatus of claim 17 wherein the bottom electrode and the bottom electrode lead are formed from a common first bottom electrode layer and a common second bottom electrode layer, wherein:
  the first bottom electrode layer is formed over the bottom surface of the piezoelectric layer, and a portion of the first bottom electrode layer is in contact with the lower interface layer of the first interface structure through the first interface opening of the piezoelectric layer;
  the second bottom electrode layer is formed underneath the first bottom electrode layer; and
  the first bottom electrode layer is formed of W or Mo, and the second bottom electrode layer is formed of AlCu.

20. The apparatus of claim 19 wherein:
the first bottom electrode layer has a thickness between 100 Å and 10000 Å; and
the second bottom electrode layer has a thickness between 100 Å and 10000 Å.

21. An apparatus comprising:
a piezoelectric layer with an interface opening;
a bottom electrode over a bottom surface of the piezoelectric layer;
a top electrode over a top surface of the piezoelectric layer, wherein:
  the top surface of the piezoelectric layer is opposite the bottom surface of the piezoelectric layer; and
  an active region for a resonator is formed where the bottom electrode and the top electrode overlap;
a top electrode lead over the top surface of the piezoelectric layer and extending from the top electrode;
an interface structure extending from the top electrode lead, and extending over the interface opening;
a Wafer-Level-Packaged (WLP) enclosure comprising a WLP cap, an outer wall, and a through-WLP via, wherein:
  the outer wall extends from the WLP cap toward the top surface of the piezoelectric layer to form a cavity, and the top electrode resides in the cavity;
  the through-WLP via extends through the WLP cap and the outer wall and is encompassed by the outer wall; and
  the through-WLP via of the WLP enclosure is vertically aligned with the interface opening of the piezoelectric layer, and a portion of the interface structure is exposed to the through-WLP via; and
an interconnect formed in the through-WLP via of the WLP enclosure and electrically connected to the interface structure.

22. The apparatus of claim 21 wherein the top electrode, the top electrode lead, and the interface structure are formed from a common first top electrode layer, a common second top electrode layer, and a common third top electrode layer, wherein:
  the first top electrode layer extends over a portion of the top surface of the piezoelectric layer and over the interface opening;
  the second top electrode layer is formed over the first top electrode layer, and the third top electrode layer is formed over the second top electrode layer;
  a portion of the third top electrode layer is exposed to the through-WLP via of the WLP enclosure and electrically connected to the interconnect; and the first top electrode layer is formed of W or Mo, the second top electrode layer is formed of AlCu, and the third top electrode layer is formed of W or Mo.

23. The apparatus of claim 21 further comprising a passivation layer with a passivation opening, wherein:
- the passivation layer is over the top electrode, the top electrode lead, and the top surface of the piezoelectric layer, such that a bottom surface of the outer wall is in contact with the passivation layer; and
- the passivation opening is vertically aligned between the through-WLP via of the WLP enclosure and the interface opening of the piezoelectric layer, such that the portion of the interface structure is exposed to the through-WLP via of the WLP enclosure through the passivation opening of the passivation layer.

24. The apparatus of claim 23 further comprising a seed layer, wherein:
- the seed layer continuously extends over exposed surfaces within the through-WLP via, such that the seed layer is in contact with the exposed portion of the interface structure through the passivation opening of the passivation layer; and
- the interconnect is formed over the seed layer.

* * * * *